United States Patent
Rowe et al.

(10) Patent No.: US 11,518,080 B2
(45) Date of Patent: Dec. 6, 2022

(54) METHODS OF MAKING EXTENSIBLE BARRIER FILMS

(71) Applicant: 3M INNOVATIVE PROPERTIES COMPANY, St. Paul, MN (US)

(72) Inventors: David J. Rowe, Roseville, MN (US); Christopher S. Lyons, St. Paul, MN (US); Kevin W. Gotrik, Hudson, WI (US); Gregg A. Ambur, San Clemente, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 17/250,944

(22) PCT Filed: Oct. 3, 2019

(86) PCT No.: PCT/IB2019/058444
§ 371 (c)(1),
(2) Date: Mar. 31, 2021

(87) PCT Pub. No.: WO2020/079518
PCT Pub. Date: Apr. 23, 2020

(65) Prior Publication Data
US 2021/0394426 A1 Dec. 23, 2021

Related U.S. Application Data

(60) Provisional application No. 62/746,236, filed on Oct. 16, 2018.

(51) Int. Cl.
*B29C 51/10* (2006.01)
*B29C 51/00* (2006.01)
(Continued)

(52) U.S. Cl.
CPC ............ *B29C 51/10* (2013.01); *B29C 51/002* (2013.01); *B29C 51/06* (2013.01); *B29C 51/14* (2013.01);
(Continued)

(58) Field of Classification Search
CPC ..... B29C 51/002; B29C 51/08; B29C 51/265; B29C 51/06; B29C 51/10; B29C 51/14;
(Continued)

(56) References Cited

U.S. PATENT DOCUMENTS 3,606,958 A * 9/1971 Coffman ................ B65D 11/16
220/660
7,018,713 B2 3/2006 Padiyath
(Continued)

FOREIGN PATENT DOCUMENTS

EP 2341759 7/2011
TW 201131854 9/2011
(Continued)

OTHER PUBLICATIONS

International Search Report for PCT International Application No. PCT/IB2019/058444, dated Dec. 3, 2019, 4 pages.

*Primary Examiner* — Monica A Huson

(57) ABSTRACT

There is provided a method of making a curved barrier film, including: depositing a barrier layer between a first organic layer and a second organic layer to form a barrier film; and thermoforming or vacuum-forming the barrier film from a flat barrier film to a curved barrier film; wherein the barrier film includes the barrier layer having two opposing major surfaces, wherein the barrier layer includes buckling deformations and non-buckling regions; the first organic layer in direct contact with one of the opposing major surfaces of the
(Continued)

barrier layer; and the second organic layer in direct contact with the other of the opposing major surfaces of the barrier layer.

10 Claims, 1 Drawing Sheet

(51) Int. Cl.
*B29C 51/06* (2006.01)
*B29C 51/14* (2006.01)
*B29C 51/26* (2006.01)
*C23C 14/00* (2006.01)
*C23C 14/08* (2006.01)
*B29K 33/00* (2006.01)
*B29K 67/00* (2006.01)

(52) U.S. Cl.
CPC ........ *B29C 51/265* (2013.01); *C23C 14/0036* (2013.01); *C23C 14/081* (2013.01); *B29K 2033/08* (2013.01); *B29K 2067/003* (2013.01); *B29K 2995/0049* (2013.01)

(58) Field of Classification Search
CPC .............. C23C 14/081; C23C 14/0036; B32B 38/1866; B29K 2995/0049; B29K 2067/003; B29K 2023/12; B29K 2027/08; B29K 2033/08; B29K 2025/06; B29K 2023/06; B29K 2027/06
See application file for complete search history.

(56) References Cited

U.S. PATENT DOCUMENTS

| | | |
|---|---|---|
| 7,465,678 B2 | 12/2008 | Bhattacharya |
| 8,624,487 B2 | 1/2014 | Han |
| 8,658,248 B2 | 2/2014 | Anderson |
| 8,987,758 B2 | 3/2015 | Han |
| 2009/0053542 A1 | 2/2009 | Kuwata |
| 2011/0210344 A1 | 9/2011 | Han |
| 2013/0140528 A1 | 6/2013 | De Kok |
| 2014/0140020 A1 | 5/2014 | Rogers |
| 2018/0267222 A1 | 9/2018 | Ambur |

FOREIGN PATENT DOCUMENTS

| | | |
|---|---|---|
| WO | WO 2002-11978 | 2/2002 |
| WO | WO 2013-062486 | 5/2013 |
| WO | WO 2016-018749 | 2/2016 |
| WO | WO 2017-106078 | 6/2017 |
| WO | WO 2017-106107 | 6/2017 |

\* cited by examiner

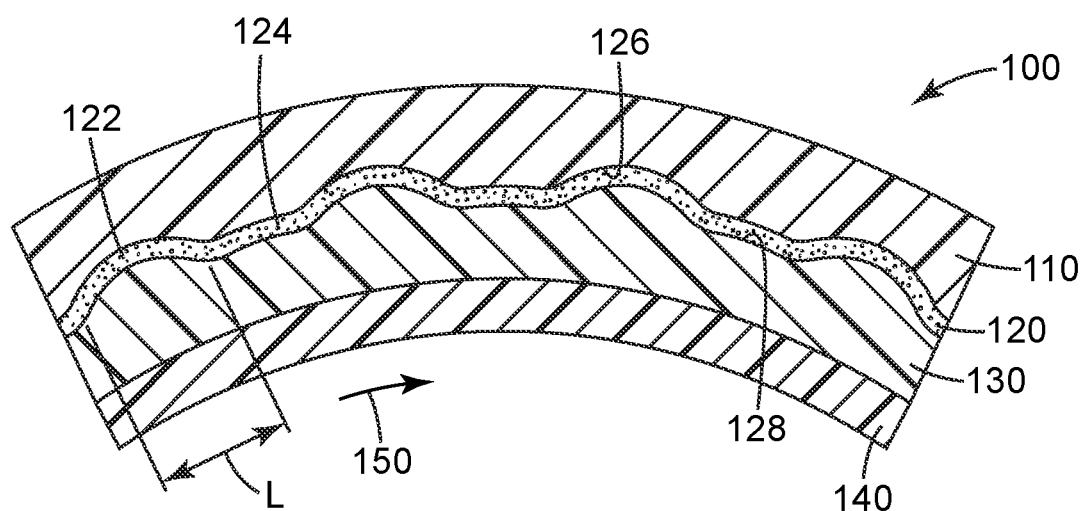

METHODS OF MAKING EXTENSIBLE BARRIER FILMS

CROSS REFERENCE TO RELATED APPLICATIONS

This application is a national stage filing under 35 U.S.C. 371 of PCT/IB2019/058444, filed Oct. 3, 2019, which claims the benefit of Provisional Application No. 62/746,236, filed Oct. 16, 2018, the disclosure of which is incorporated by reference in its/their entirety herein.

FIELD

The present disclosure relates to methods of making barrier films.

BACKGROUND

Many electronic devices are sensitive to environmental gases and liquids and are prone to degradation on permeation of the environmental gases and liquids such as oxygen and water vapor. Inorganic or hybrid inorganic/organic layers have been used in thin films for electrical, packaging and decorative applications to prevent the degradation. For example, multilayer stacks of inorganic or hybrid inorganic/organic layers can be used to make barrier films resistant to moisture permeation. Multilayer barrier films have also been developed to protect sensitive materials from damage due to water vapor. The water sensitive materials can be electronic components such as organic, inorganic, and hybrid organic/inorganic semiconductor devices. While the technology of the prior art may be useful, there exists a need for better barrier films useful for packaging.

SUMMARY

In one aspect, the present disclosure provides a method of making a curved barrier film, comprising: (a) depositing a barrier layer between a first organic layer and a second organic layer to form a barrier film; and (b) thermoforming or vacuum-forming the barrier film from a flat barrier film to a curved barrier film; wherein the barrier film comprises the barrier layer having two opposing major surfaces, wherein the barrier layer comprises buckling deformations and non-buckling regions; the first organic layer in direct contact with one of the opposing major surfaces of the barrier layer; and the second organic layer in direct contact with the other of the opposing major surfaces of the barrier layer.

Various aspects and advantages of exemplary embodiments of the present disclosure have been summarized. The above Summary is not intended to describe each illustrated embodiment or every implementation of the present disclosure. Further features and advantages are disclosed in the embodiments that follow. The Drawings and the Detailed Description that follow more particularly exemplify certain embodiments using the principles disclosed herein.

DEFINITIONS

For the following defined terms, these definitions shall be applied for the entire Specification, including the claims, unless a different definition is provided in the claims or elsewhere in the Specification based upon a specific reference to a modification of a term used in the following definitions:

The terms "a", "an", and "the" include plural referents unless the content clearly dictates otherwise. Thus, for example, reference to a material containing "a compound" includes a mixture of two or more compounds.

The term "layer" refers to any material or combination of materials on or overlaying a substrate.

The term "separated by" to describe the position of a layer with respect to another layer and the substrate, or two other layers, means that the described layer is between, but not necessarily contiguous with, the other layer(s) and/or substrate.

The term "(co)polymer" or "(co)polymeric" includes homopolymers and copolymers, as well as homopolymers or copolymers that may be formed in a miscible blend, e.g., by coextrusion or by reaction, including, e.g., transesterification. The term "copolymer" includes random, block, graft, and star copolymers.

BRIEF DESCRIPTION OF THE DRAWINGS

The disclosure may be more completely understood in consideration of the following detailed description of various embodiments of the disclosure in connection with the accompanying figures, in which:

FIG. 1 is a side view of an exemplary barrier film made according to the present invention.

While the above-identified drawings, which may not be drawn to scale, set forth various embodiments of the present disclosure, other embodiments are also contemplated, as noted in the Detailed Description. In all cases, this disclosure describes the presently disclosed invention by way of representation of exemplary embodiments and not by express limitations. It should be understood that numerous other modifications and embodiments can be devised by those skilled in the art, which fall within the scope and spirit of this disclosure.

DETAILED DESCRIPTION

Before any embodiments of the present disclosure are explained in detail, it is understood that the invention is not limited in its application to the details of use, construction, and the arrangement of components set forth in the following description. The invention is capable of other embodiments and of being practiced or of being carried out in various ways that will become apparent to a person of ordinary skill in the art upon reading the present disclosure. Also, it is understood that the phraseology and terminology used herein is for the purpose of description and should not be regarded as limiting. The use of "including," "comprising," or "having" and variations thereof herein is meant to encompass the items listed thereafter and equivalents thereof as well as additional items. It is understood that other embodiments may be utilized and structural or logical changes may be made without departing from the scope of the present disclosure.

As used in this Specification, the recitation of numerical ranges by endpoints includes all numbers subsumed within that range (e.g. 1 to 5 includes 1, 1.5, 2, 2.75, 3, 3.8, 4, and 5, and the like).

Unless otherwise indicated, all numbers expressing quantities or ingredients, measurement of properties and so forth used in the Specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Inorganic layers of barrier films are susceptible to strain induced failure. Typically, when an inorganic oxide is exposed to conditions that induce more than 0.5% tensile strain, then the inorganic oxide will experience a multitude of in-plane fractures lowering its diffusion properties by orders of magnitude. Potential vapor coatings of interest for thermoforming may be coatings that can be applied to optical lenses. In the case of optical lenses for electrochromic eyeglasses, coatings such as antireflective coatings, barrier coatings, or transparent conductive electrodes are of interest. Unfortunately, these coatings typically include layers at sufficient thicknesses that the coating is brittle and prone to cracking during the stretching associated with thermoforming. The present disclosure provides a process used to produce high performing thermoformed barrier films substantially free of cracks.

In some embodiments, the present disclosure provides a method of making a curved barrier film. A barrier layer is deposited between a first organic layer and a second organic layer to form a barrier film. A curved barrier film can be then formed by thermoforming the barrier film from a flat barrier film. The first organic layer and the second organic layer can be cured. The barrier film of the present disclosure can be made by heat shrinking. The method of the present disclosure can include applying heat to the barrier film before the step of the curved barrier film formed by thermoforming or vacuum-forming. Applying heat to the barrier film can include applying heat to the barrier film for pre-compression of the barrier film. The first organic layer or the second organic layer can be deposited on a heat-shrinkable substrate and the barrier layer is deposited between a first organic layer and a second organic layer to form a layer construction. After heat-shrinking this construction, the curved barrier film formed by the above described method, can have buckling deformations as shown in FIG. 1.

Unless otherwise specified, the barrier layer of the various embodiments may be deposited by any suitable method, for example, by any one of sputtering, evaporation, chemical vapor deposition, plasma enhanced chemical vapor deposition, sublimation, electron cyclotron resonance-plasma enhanced chemical vapor deposition, physical vapor deposition, atomic layer deposition, and combinations thereof.

The first and second organic layers may be deposited by any suitable method, for example, by applying a layer of a monomer or oligomer to the substrate and crosslinking the layer to forth the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating gravure roll coating), die coating (e.g., slot die coating), spin coating, dip coating, or spray coating (e.g., electrostatic spray coating or ink jet coating), then crosslinked as set out above. The organic layers can also be formed by applying a layer containing an oligomer or polymer in solvent and drying the thus-applied layer to remove the solvent. Unless otherwise specified, the curved barrier film of the various embodiments may be by any suitable thermoforming method, for example, by the method described in U.S. Publication Number US 2018/0267222 A1 (Ambur et al.), which is incorporated herein by reference in their entirety into this disclosure. In general, a formed film is produced by pressing a film against a curved mold with high force to create a film that matches the surface geometry of the mold surface. The film may be first heated to allow the film to more easily move and stretch to conform to the mold surface. In thermoforming, gas pressure is the force used to push the film against the mold surface. In the case of vacuum-forming, air is evacuated from one side of the mold, and atmospheric pressure is used to push the film against the mold surface. Alternatively, pressurized gas can be used instead of a vacuum to push the film against the mold surface.

The barrier film of the present disclosure can also be formed by pre-straining a reversibly stretchable film. In some embodiments, the reversibly stretchable film can be formed of a reversibly stretchable material, such as an elastomer. The reversibly stretchable film is pre-stretched by a predetermined pre-stretch percentage represented by X %. The pre-stretched percentage X % can be in the range of about 0.5% to about 500%, about 0.5% to about 50%, about 0.5% to about 10%. The strained stretchable film is laminated to a rigid polymeric or metal substrate and a barrier layer is deposited on the strained stretchable film with techniques described above. After a first organic layer is deposited on the barrier layer, the reversibly stretchable film is released from the rigid polymeric or metal substrate and relaxed. Buckling deformations formed by this method has a wavy or buckled profile. Optionally, an adhesive can be deposited between the rigid substrate and the reversibly stretchable film.

Referring now to FIG. 1, an exemplary curved barrier film 100 made according to the present disclosure is illustrated. Barrier film 100 includes a barrier layer 120 which has first 126 and second 128 opposing major surfaces. In the embodiment shown in FIG. 1, in direct contact with the first opposing major surface 126 of the barrier layer 120 is a first organic layer 110 and a second organic layer 130 is in direct contact with the second opposing major surface 128 of the barrier layer 120. In other embodiments, the layer to be described as the second organic layer 130 may be in direct contact with the first opposing major surface 126 of the barrier layer 120 and the first organic layer 110 is in direct contact with the second opposing major surface 128 of the barrier layer 120. Barrier film 100 may also include a substrate 140 in direct contact with the first organic layer 110 or the second organic layer 130. In the embodiment of FIG. 1, substrate 140 is in direct contact with the second organic layer 130. Alternatively, substrate 140 can be in direct contact with the first organic layer 110. Barrier layer 120 has buckling deformations 122 and non-buckling regions 124. In some embodiments, buckling deformations may be irregular. Although as shown in FIG. 1, one buckling deformation is followed by one non-buckling region, the number of buckling deformations between two adjacent non-buckling regions can be any number, for example, 1, 2, 3, 4, 5, etc. For example, in some embodiments, multiple continuous buckling deformations can be between two non-buckling regions. In some embodiments, multiple continuous buckling deformations can be followed by multiple continuous non-buckling regions. In some embodiments, non-buckling regions can be located at the end of barrier layer 120. As shown in FIG. 1, buckling deformations 122 have a length L. In some embodiments, the length L of buckling deformations 122 may be no more than 400 nm, no more than 300 nm, no more than 200 nm, no more than 100 nm, no more than 50 nm, no more than 40 nm, no more than 30 nm, or no more than 20 nm. In some embodiments, the length L of buckling deformations 122 may be no less than 2 nm, no less than 5 nm, no less than 10 nm, no less than 20 nm. Buckling deformations 122 may project along a first direction 150 as shown in FIG. 1. In some embodiments, buckling deformations 122 may project along a second direction, which is different from the first direction 150. In some embodiments, buckling deformations 122 may project along both the first direction and the second direction. In some embodiments, the first direction and the second direction can be mutually perpendicular to each other. For example, the first direction is along the x-axis of the barrier layer and the second direction is along the y-axis of the barrier layer. However, it should be appreciated that the first direction and the second direction can also be along other axes of the barrier layer. For example, if the barrier layer 120, when viewed from the top, is rectangular in shape, then first direction can be along a length of the rectangular surface and the second direction can be along the breadth of the rectangular surface.

Barrier layer 120 is characterized by buckling deformations and non-buckling regions. Non-buckling regions, e.g., regions having substantially straight lines or substantially sharp edges, can provide technical benefits. For example, it is easy and convenient to make the barrier layers with non-buckling regions and thus reduces the manufacturing cost. In addition, by forming buckling deformations in barrier layer, a pre-determined amount of compressive stress and additional surface area can be introduced into the barrier layer. In effect, the barrier layer builds up an amount of total surface area greater than the given projected two-dimensional area that is then unraveled when the barrier film undergoes tensile strain. Therefore, when the barrier film is stretched, the buckling deformations can alleviate stress and help the barrier film elongate, thereby reducing strain induced failure. This allows the barrier film of the present disclosure to bend in at least one direction in a plane along the surface of the barrier film in reaction to at least one of thermal stress, mechanical stress, and load caused by deformation of an adjoining substrate or layer, thereby reducing build-up of the stress or the load and preventing the barrier film from fracturing or cracking. The stress or the load can be a result of an outside force, including the forces involved in thermoforming. The stress or the load can also be caused due to temperature variation in combination with different thermal expansion coefficients of barrier layers and adjoining layers or substrate. Further, the stress or the load can also be caused due to deformation of the adjoining layers or substrate. Also, the stress or the load can be caused due to humidity absorption and resulting expansion of the adjoining layers or substrate.

In some of these embodiments, the curved barrier film can be uniaxially or biaxially stretched to no less than 1%, no less than 2%, no less than 3%, no less than 5% or no less than 10% relative to its unstretched state and the curved barrier film is substantially free of fractures or cracks.

Substrates

The substrate 140 can be heat-shrinkable. The heat-shrinkable substrate can shrink at a predetermined temperature. Suitable substrate 140 can be conveniently an organic polymeric layer that is processed to be heat-shrinkable by any suitable means. Semicrystalline or amorphous polymers can be made heat-shrinkable by orienting them at a temperature above their glass transition temperature, Tg, and then cooling. Examples of useful semicrystalline polymeric films include polyolefins such as polyethylene (PE), polypropylene (PP), and syndiotactic polystyrene (sPS); polyesters such as polyethylene terephthalate (PET), polyethylene napthalate (PEN), and polyethylene-2,6-naphthalate; fluoropolymers such as polyvinylidene difluoride, and ethylene: tetrafluoroethylene copolymers (ETFE); polyamides such as Nylon 6 and Nylon 66; polyphenylene oxide, and polyphenylene sulfide. Examples of amorphous polymer films include polymethylmethacrylate (PMMA), polycarbonate (PC), polyether sulfone (PES), atactic polystyrene (aPS), polyvinyl chloride (PVC), and norbornene based cyclic olefin polymer (COP) and cyclic olefin copolymer (COC). Some polymer materials are available in both semicrystalline and amorphous forms. Semicrystalline polymers such as those listed above can also be made heat-shrinkable by heating to the peak crystallization temperature and cooling.

Biaxially or uniaxially oriented polyethylene terephthalate (PET) with a thickness of approximately 0.002 inch (0.05 mm) is considered a convenient choice, as is biaxially oriented polypropylene (BOPP) film. Biaxially oriented polypropylene (BOPP) is commercially available from several suppliers including: ExxonMobil Chemical Company of Houston, Tex.; Continental Polymers of Swindon, UK; Kaisers International Corporation of Taipei City, Taiwan and PT Indopoly Swakarsa Industry (ISI) of Jakarta, Indonesia. Other examples of suitable film material are taught in WO 02/11978, titled "Cloth-like Polymeric Films," (Jackson et al.). In some embodiments, the substrate may be a lamination of two or more polymeric layers.

Organic Layer

The first and second organic layers may be made from the same material or different materials. The organic layers may be made of at least one selected from among, but not limited to, organic polymers, polymers including inorganic elements, organometallic polymers, hybrid organic/inorganic polymer systems, and combinations thereof. The organic polymers may be at least one selected from among, but not limited to, urethanes, polyamides, polyimides, fluoropolymers, polybutylenes, isobutylene isoprene, polyolefins, epoxies, thiol-enes, parylenes, benzocyclobutadiene, polynorbornenes, polyarylethers, polycarbonates, alkyds, polyaniline, ethylene vinyl acetate, ethylene acrylic acid, and combinations thereof. The polymers including inorganic elements may be at least one selected from among, but not limited to, silicones, polyphosphazenes, polysilazanes, polycarbosilanes, polycarboranes, carborane siloxanes, polysilanes, phosphonitriles, sulfur nitride polymers, siloxanes, polyorganotitanates, polyorganozirconates, and combinations thereof. The organometallic polymers may be at least one selected from among, but not limited to, organometallic polymers of main group metals, transition metals, and lanthanide/actinide metals, and combinations thereof. The hybrid organic/inorganic polymer systems may be at least one selected from among, but not limited to, organically modified silicates, preceramic polymers, polyimide-silica hybrids, (meth)acrylate-silica hybrids, polydimethylsiloxane-silica hybrids, and combinations thereof.

In some embodiments, the first organic layer or the second organic layer can include an acrylate or an acrylamide. When the organic layers are to be formed by flash evaporation of the monomer, vapor deposition, followed by cross-linking, volatilizable acrylate and methacrylate (referred to herein as "(meth)acrylate") or acrylamide or methacrylamide (referred to herein as "(meth)acrylamide") monomers are useful, with volatilizable acrylate monomers being preferred. A suitable (meth)acrylate or (meth) acrylamide monomer has sufficient vapor pressure to be evaporated in an evaporator and condensed into a liquid or solid coating in a vapor coater.

Examples of suitable monomers include, but are not limited to, hexanediol diacrylate; ethoxyethyl acrylate; cyanoethyl (mono)acrylate; isobornyl (meth)acrylate; octadecyl acrylate; isodecyl acrylate; lauryl acrylate; beta-carboxyethyl acrylate; tetrahydrofurfuryl acrylate; dinitrile acrylate; pentafluorophenyl acrylate; nitrophenyl acrylate; 2-phenoxyethyl (meth)acrylate; 2,2,2-trifluoromethyl (meth)acrylate; diethylene glycol diacrylate; triethylene glycol di(meth)acrylate; tripropylene glycol diacrylate; tetraethylene glycol diacrylate; neo-pentyl glycol diacrylate; propoxylated neopentyl glycol diacrylate; polyethylene glycol diacrylate; tetraethylene glycol diacrylate; bisphenol A epoxy diacrylate; 1,6-hexanediol dimethacrylate; trimethylol propane triacrylate; ethoxylated trimethylol propane triacrylate; propylated trimethylol propane triacrylate; tris(2-hydroxyethyl)-isocyanurate triacrylate; pentaerythritol triacrylate; phenylthioethyl acrylate; naphthloxyethyl acrylate; neopentyl glycol diacrylate, MIRAMER M210 (available from Miwon Specialty Chemical Co., Ltd., Korea), KAYARAD R-604 (available from Nippon Kayaku Co., Ltd., Tokyo, Japan), epoxy acrylate under the product number RDX80094 (available from RadCure Corp., Fairfield, N.J.); and mixtures thereof. A variety of other curable materials can be included in the polymer layer, such as, e.g., vinyl ethers, vinyl napthalene, acrylonitrile, and mixtures thereof.

In particular, tricyclodecane dimethanol diacrylate is considered suitable. It is conveniently applied by, e.g., condensed organic coating followed by UV, electron beam, or plasma initiated free radical vinyl polymerization. A thickness between about 250 and 10000 nm is considered convenient, with approximately between about 750 and 5000 nm in thickness being considered particularly suitable. In some embodiments, thickness of organic layer can be between about 1000 and 3000 nm.

Barrier Layer

The barrier layer 120 may include at least one selected from the group consisting of metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, and combinations thereof.

In some embodiments, the barrier layer 120 may conveniently be formed of metal oxides, metal nitrides, metal oxy-nitrides, and metal alloys of oxides, nitrides and oxynitrides. In one aspect the barrier layer 120 may include a metal oxide. In some embodiments, the barrier layer 120 may include at least one selected from the group consisting of silicon oxides such as silica, aluminum oxides such as alumina, titanium oxides such as titania, indium oxides, tin oxides, indium tin oxide (ITO), haffnium oxide, tantalum oxide, zirconium oxide, zinc oxide, niobium oxide, and combinations thereof. Preferred metal oxides may include aluminum oxide, silicon oxide, silicon aluminum oxide, aluminum-silicon-nitride, and aluminum-silicon-oxy-nitride, CuO, $TiO_2$, ITO, ZnO, aluminum zinc oxide, $ZrO_2$, and yttria-stabilized zirconia. Preferred nitrides may include $Si_3N_4$ and TiN. The barrier layer 120 can typically be prepared by reactive evaporation, reactive sputtering, chemical vapor deposition, plasma enhanced chemical vapor deposition, and atomic layer deposition. Preferred methods include vacuum preparations such as reactive sputtering and plasma enhanced chemical vapor deposition, and atomic layer deposition.

The barrier layer is conveniently applied as a thin layer. The barrier layer material, e.g. silicon aluminum oxide, can for example, provide good barrier properties, as well as good interfacial adhesion to organic layers. Such layers are conveniently applied by sputtering, and a thickness between about 5 and 100 nm is considered convenient, with approximately 27 nm in thickness being considered particularly suitable.

The following embodiments are intended to be illustrative of the present disclosure and not limiting.

EMBODIMENTS

Embodiment 1 is a method of making a curved barrier film, comprising: (a) depositing a barrier layer between a first organic layer and a second organic layer to form a barrier film; and (b) thermoforming or vacuum-forming the barrier film from a flat barrier film to a curved barrier film; wherein the barrier film comprises the barrier layer having two opposing major surfaces, wherein the barrier layer comprises buckling deformations and non-buckling regions; the first organic layer in direct contact with one of the opposing major surfaces of the barrier layer; and the second organic layer in direct contact with the other of the opposing major surfaces of the barrier layer.

Embodiment 2 is the method of embodiment 1, further comprising applying heat to the barrier film before the step (b).

Embodiment 3 is the method of embodiment 2, wherein applying heat to the barrier film comprises applying heat to the barrier film for pre-compression of the barrier film.

Embodiment 4 is the method of any one of embodiments 1 to 3, further comprising depositing the first organic layer or the second organic layer on a substrate.

Embodiment 5 is the method of embodiment 4, wherein the substrate is heat-shrinkable.

Embodiment 6 is the method of embodiment 4, wherein the heat-shrinkable substrate shrinks at a predetermined temperature.

Embodiment 7 is the method of embodiment 4, wherein the heat shrinkable substrate comprises an organic polymer.

Embodiment 8 is the method of any one of embodiments 1 to 7, wherein the barrier layer comprises at least one selected from the group consisting of metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, and combinations thereof.

Embodiment 9 is the method of embodiment 8, wherein the barrier layer comprises metal oxide.

Embodiment 10 is the method of embodiment 9, wherein the metal oxide is selected from the group of silicon oxides, aluminum oxides, titanium oxides, indium oxides, tin oxides, indium tin oxide (ITO), hafnium oxide, tantalum oxide, zirconium oxide, zinc oxide, niobium oxide, and combinations thereof.

Embodiment 11 is the method of any one of embodiments 1 to 10, wherein the first organic layer or the second organic layer comprises an acrylate.

Embodiment 12 is the method of any one of embodiments 1 to 11, wherein the curved barrier film is stretched to no less than 1% relative to its unstretched flat state.

EXAMPLES

Test Methods
Optical Haze Measurements

Optical haze measurements were made using a BYK Hazegard Plus instrument (BYK Gardner USA Company, Columbia, Md.) according to the vendor's instructions. The instrument was calibrated to 0% haze before the measurement process. Samples were cleaned with compressed air prior to measurements to remove any residual dust or debris.

To measure flat samples (barrier films of Comparative Examples A and B), 3 inch by 3 inch (7.62 cm by 7.62 cm) samples were prepared and measured in three different orientations. The mean value was reported as 'Percent Haze'. For the thermoformed samples (barrier films of Examples 1-3 and Comparative Example C), the convex side of the sample was placed on the measurement stage and measured in three different orientations to provide a mean value of 'Percent Haze'.

EXAMPLES

The following Examples of barrier films were made on a vacuum coater similar to the coater described in U.S. Pat. No. 8,658,248 (Anderson et al.) and U.S. Pat. No. 7,018,713 (Padiyath, et al.).

For examples 1-3, the coater was threaded up with substrate in the form of an indefinite length roll [0.05 mm thick, 14 inch (35.6 cm) wide] of heat shrinkable, biaxially oriented ScotchShield Ultra PET film (commercially available from the 3M Corporation, Maplewood, Minn.). The substrate was advanced at a constant line speed of 16 fpm (4.9 meters/minute). The substrate was prepared for coating by subjecting it to a 20 W nitrogen plasma treatment to improve the adhesion of the first organic layer.

For comparative examples B and C, the coater was threaded up with substrate in the form of an indefinite length roll [0.05 mm thick, 14 inch (35.6 cm) wide] of heat stabilized MELINEX STCH11 PET film (commercially available from Dupont Teijin Films, Chester, Va.). The substrate was advanced at a constant line speed of 16 fpm (4.9 meters/minute). The substrate was prepared for coating by subjecting it to a 20 W nitrogen plasma treatment to improve the adhesion of the first organic layer.

Example 1

A first organic layer was formed on the ScotchShield Ultra PET Substrate by applying tricyclodecane dimethanol diacrylate (commercially available as SARTOMER SR833S from Sartomer USA, Exton, Pa.) by ultrasonic atomization and flash evaporation to make a coating width of 12.5 inches (31.75 cm). This monomeric coating was subsequently cured immediately downstream with an electron beam curing gun operating at 7.0 kV and 4.0 mA. The flow of liquid monomer into the evaporator was 1.33 mL/minute, the nitrogen gas flow rate was 60 sccm and the evaporator temperature was set at 260° C. The process drum temperature was −10° C. The first organic layer was about 750 nm thick.

On top of this first organic layer, a barrier layer of silicon aluminum oxide was deposited by AC reactive sputtering. The cathode had a Si(90%)/Al(10%) target obtained from Soleras Advanced Coatings US (Biddeford, Me.). The voltage for the cathode during sputtering was controlled by a feed-back control loop that monitored the voltage and controlled the oxygen flow such that the voltage would remain high and not crash the target voltage. The system was operated at 16 kW and 600 V under 3 mTorr of argon to deposit approximately a 25 nm thick layer of silicon aluminum oxide onto the organic layer.

A further in-line process was used to deposit a second organic layer on top of the silicon aluminum oxide layer. The second organic layer was produced from monomer solution by ultrasonic atomization and flash evaporation. The material applied to form the second organic layer was a mixture of 3 wt % (N-(n-butyl)-3-aminopropyltrimethoxysilane, commercially available under the trade designation DYNA-SYLAN 1189 (Evonik Industries AG, Essen, Germany), and SARTOMER SR833S. The flow rate of this mixture into the atomizer was 1.33 mL/minute, the nitrogen gas flow rate was 60 sccm, and the evaporator temperature was 260° C. The process drum temperature was −10° C. Once condensed onto the silicon aluminum oxide layer, the coated mixture was cured with an electron beam curing gun operating at 7.0 kV and 10.0 mA. The second organic layer was about 750 nm thick.

A 6 inch by 6 inch (15.24 cm by 15.24 cm) sheet of the resulting barrier film was laminated with a release film (0.05 mm thick PET film with a low tack adhesive) applied to each face of the barrier film. The sheet was then paced into an ACCUFORM IL Series High Pressure Forming Unit (Hy-Tech Forming Systems USA, Phoenix, Ariz.). The thermoforming tool that was fitted with a 75 mm diameter, base-6 lens curvature forming die. The forming temperature on the heated platen was set at 150-176° C. The laminated barrier film sheet was pressed against the platen at 60 psi for six seconds. The sheet was then pressed against the forming die at 500 psi for six seconds. The resulting curved film was then removed from the thermoforming unit and allowed to cool to ambient temperature. The release films were removed and the formed barrier film was evaluated for haze. The results are presented in Table 1. The curved barrier film showed only minor cracking when imaged using a Leica DM4000M optical microscope with 5×, 10×, and 20× objectives and viewed under bright field conditions (Leica Microsystems, Buffalo Grove, Ill.).

Example 2

A first organic layer was formed on the ScotchShield Ultra PET Substrate by applying tricyclodecane dimethanol diacrylate (commercially available as SARTOMER SR833S from Sartomer USA) by ultrasonic atomization and flash evaporation to make a coating width of 12.5 inches (31.75 cm). This monomeric coating was subsequently cured immediately downstream with an electron beam curing gun operating at 7.0 kV and 4.0 mA. The flow of liquid monomer into the evaporator was 1.33 mL/minute, the nitrogen gas flow rate was 60 sccm and the evaporator temperature was set at 260° C. The process drum temperature was −10° C. The first organic layer was about 750 nm thick.

On top of this first organic layer, a barrier layer of silicon aluminum oxide was deposited by AC reactive sputtering. The cathode had a Si(90%)/Al(10%) target obtained from Soleras Advanced Coatings US. The voltage for the cathode during sputtering was controlled by a feed-back control loop that monitored the voltage and controlled the oxygen flow such that the voltage would remain high and not crash the target voltage. The system was operated at 16 kW and 600 V under 3 mTorr of argon to deposit approximately a 25 nm thick layer of silicon aluminum oxide onto the organic layer.

A further in-line process was used to deposit a second organic layer on top of the silicon aluminum oxide layer. The second organic layer was produced from monomer solution by ultrasonic atomization and flash evaporation. The material applied to form the second organic layer was a mixture of 3 wt % (N-(n-butyl)-3-aminopropyltrimethoxysilane, commercially available under the trade designation DYNA-SYLAN 1189, and SARTOMER SR833S. The flow rate of this mixture into the atomizer was 1.33 mL/minute, the nitrogen gas flow rate was 60 sccm, and the evaporator temperature was 260° C. The process drum temperature was −10° C. Once condensed onto the silicon aluminum oxide layer, the coated mixture was cured with an electron beam curing gun operating at 7.0 kV and 10.0 mA. The second organic layer was about 750 nm thick.

A 22.5 cm by 22.5 cm section of the resulting barrier film was further processed using a Karo IV batch orienter (Bruckner Maschinenbau GmbH & Co. KG, Siegsdorf, Germany) with the temperature in the stretching oven set at 165° C. The barrier film section was placed in the loading zone of the Karo orienter by fixing the boundary of the film section in one in-plane dimension and allowing the orthogonal in-plane direction to relax by 10% relative to its initial size dimensions when tautly held in the orienter. The article was then sent to the stretch oven for 5 minutes where it was allowed to heat shrink along the dimension relaxed by 10%. The barrier film section was then removed from the oven and allowed to cool to ambient temperature.

A 6 inch by 6 inch (15.24 cm by 15.24 cm) sheet of the resulting barrier film was laminated with a release film (0.05 mm thick PET film with a low tack adhesive) applied to each face of the barrier film. The sheet was then paced into an ACCUFORM IL Series High Pressure Forming Unit (Hy-Tech Forming Systems USA, Phoenix, Ariz.). The thermoforming tool that was fitted with a 75 mm diameter, base-6 lens curvature forming die. The forming temperature on the heated platen was set at 150-176° C. The laminated barrier film sheet was pressed against the platen at 60 psi for six seconds. The sheet was then pressed against the forming die at 500 psi for six seconds. The resulting curved film was then removed from the thermoforming unit and allowed to cool to ambient temperature. The release films were removed and the formed barrier film was evaluated for haze. The results are presented in Table 1.

Example 3

A first organic layer was formed on the ScotchShield Ultra PET Substrate by applying tricyclodecane dimethanol diacrylate (commercially available as SARTOMER SR833S from Sartomer USA) by ultrasonic atomization and flash evaporation to make a coating width of 12.5 inches (31.75 cm). This monomeric coating was subsequently cured immediately downstream with an electron beam curing gun operating at 7.0 kV and 4.0 mA. The flow of liquid monomer into the evaporator was 1.33 mL/minute, the nitrogen gas flow rate was 60 sccm and the evaporator temperature was set at 260° C. The process drum temperature was −10° C. The first organic layer was about 750 nm thick.

On top of this first organic layer, a barrier layer of silicon aluminum oxide was deposited by AC reactive sputtering. The cathode had a Si(90%)/Al(10%) target obtained from Soleras Advanced Coatings US (Biddeford, Me.). The voltage for the cathode during sputtering was controlled by a feed-back control loop that monitored the voltage and controlled the oxygen flow such that the voltage would remain high and not crash the target voltage. The system was operated at 16 kW and 600 V under 3 mTorr of argon to deposit approximately a 25 nm thick layer of silicon aluminum oxide onto the organic layer.

A further in-line process was used to deposit a second organic layer on top of the silicon aluminum oxide layer. The second organic layer was produced from monomer solution by ultrasonic atomization and flash evaporation. The material applied to form the second organic layer was a mixture of 3 wt % (N-(n-butyl)-3-aminopropyltrimethoxysilane, commercially available under the trade designation DYNA-SYLAN 1189, and SARTOMER SR833S. The flow rate of this mixture into the atomizer was 1.33 mL/minute, the nitrogen gas flow rate was 60 sccm, and the evaporator temperature was 260° C. The process drum temperature was −10° C. Once condensed onto the silicon aluminum oxide layer, the coated mixture was cured with an electron beam curing gun operating at 7.0 kV and 10.0 mA. The second organic layer was about 750 nm thick.

A 22.5 cm by 22.5 cm section of the resulting barrier film was further processed using a Karo IV batch orienter (Bruckner Maschinenbau GmbH & Co. KG, Siegsdorf, Germany) with the temperature in the stretching oven set at 165° C. The barrier film section was placed in the loading zone of the Karo orienter by fixing the boundary of the film section in one in-plane dimension and allowing the orthogonal in-plane direction to relax by 10% relative to its initial size dimensions when tautly held in the orienter. The article was then sent to the stretch oven for 5 minutes where it was allowed to heat shrink along the dimension relaxed by 10%. The barrier film section was then removed from the oven and allowed to cool to ambient temperature.

The resulting relaxed barrier film section was reloaded into the Karo IV orienter and heated in the oven at 165° C. for 5 minutes followed by stretching (5% at a constant rate of 1% per second) along the same axis that was previously allowed to relax. This additional stretching step was included to relieve some of the compressive stress in the film. The stretched barrier film section was then removed from the oven and allowed to cool to ambient temperature.

A 6 inch by 6 inch (15.24 cm by 15.24 cm) sheet of the resulting barrier film was laminated with a release film (0.05 mm thick PET film with a low tack adhesive) applied to each face of the barrier film. The sheet was then paced into an ACCUFORM IL Series High Pressure Forming Unit (Hy-Tech Forming Systems USA, Phoenix, Ariz.). The thermoforming tool that was fitted with a 75 mm diameter, base-6 lens curvature forming die. The forming temperature on the heated platen was set at 150-176° C. The laminated barrier film sheet was pressed against the platen at 60 psi for six seconds. The sheet was then pressed against the forming die at 500 psi for six seconds. The resulting curved film was then removed from the thermoforming unit and allowed to cool to ambient temperature. The release films were removed and the formed barrier film was evaluated for haze. The results are presented in Table 1. The curved barrier film was substantially free of cracking when imaged using a Leica DM4000M optical microscope with 5×, 10×, and 20× objectives and viewed under bright field conditions.

Comparative Example A

Comparative Example A was a flat sheet of the barrier film prepared in Example 1 that did not undergo the final thermoforming step of Example 1. A section of the barrier film was evaluated for haze according to the procedure described above. The results are presented in Table 1.

Comparative Example B

A first organic layer was formed on the MELINEX STCH11 PET substrate by applying tricyclodecane dimethanol diacrylate (commercially available as SARTOMER SR833S from Sartomer USA) by ultrasonic atomization and flash evaporation to make a coating width of 12.5 inches (31.75 cm). This monomeric coating was subsequently cured immediately downstream with an electron beam curing gun operating at 7.0 kV and 4.0 mA. The flow of liquid monomer into the evaporator was 1.33 mL/minute, the nitrogen gas flow rate was 60 sccm and the evaporator temperature was set at 260° C. The process drum temperature was −10° C. The first organic layer was about 750 nm thick.

On top of this first organic layer, a barrier layer of silicon aluminum oxide was deposited by AC reactive sputtering. The cathode had a Si(90%)/Al(10%) target obtained from Soleras Advanced Coatings US (Biddeford, Me.). The voltage for the cathode during sputtering was controlled by a feed-back control loop that monitored the voltage and controlled the oxygen flow such that the voltage would remain high and not crash the target voltage. The system was operated at 16 kW and 600 V under 3 mTorr of argon to deposit approximately a 25 nm thick layer of silicon aluminum oxide onto the organic layer.

A further in-line process was used to deposit a second organic layer on top of the silicon aluminum oxide layer. The second organic layer was produced from monomer solution by ultrasonic atomization and flash evaporation. The material applied to form the second organic layer was a mixture of 3 wt % (N-(n-butyl)-3-aminopropyltrimethoxysilane, commercially available under the trade designation DYNA-SYLAN 1189, and SARTOMER SR833S. The flow rate of this mixture into the atomizer was 1.33 mL/minute, the nitrogen gas flow rate was 60 sccm, and the evaporator temperature was 260° C. The process drum temperature was −10° C. Once condensed onto the silicon aluminum oxide layer, the coated mixture was cured with an electron beam curing gun operating at 7.0 kV and 10.0 mA. The second organic layer was about 750 nm thick.

A 3 inch by 3 inch section of the resulting barrier was evaluated for haze according to the procedure described above. The results are presented in Table 1.

Comparative Example C

A 6 inch by 6 inch (15.24 cm by 15.24 cm) sheet of the barrier film of Comparative Example B was laminated with a release film (0.05 mm thick PET film with a low tack adhesive) applied to each face of the barrier film. The sheet was then paced into an ACCUFORM IL Series High Pressure Forming Unit (Hy-Tech Forming Systems USA, Phoenix, Ariz.). The thermoforming tool that was fitted with a 75 mm diameter, base-6 lens curvature forming die. The forming temperature on the heated platen was set at 150-176° C. The laminated barrier film sheet was pressed against the platen at 60 psi for six seconds. The sheet was then pressed against the forming die at 500 psi for six seconds. The resulting curved film was then removed from the thermoforming unit and allowed to cool to ambient temperature. The release films were removed and the formed barrier film was evaluated for haze. The results are presented in Table 1.

The curved barrier film showed many large cracks when imaged using a Leica DM4000M optical microscope with 5×, 10×, and 20× objectives and viewed under bright field conditions.

TABLE 1

Mean Percent Haze Measurements of Barrier Films

| | Substrate | Thermoformed Barrier Film | Pre-Compression Step | Mean Percent Haze |
|---|---|---|---|---|
| Example 1 | Heat Shrinkable PET | YES | NO | 3.37 |
| Example 2 | Heat Shrinkable PET | YES | YES | 1.44 |
| Example 3 | Heat Shrinkable PET | YES | YES | 1.53 |
| Comparative Example A | Heat Shrinkable PET | NO | NO | 1.55 |
| Comparative Example B | Heat Stabilized PET | NO | NO | 0.71 |
| Comparative Example C | Heat Stabilized PET | YES | NO | 9.40 |

All references and publications cited herein are expressly incorporated herein by reference in their entirety into this disclosure. Illustrative embodiments of this invention are discussed and reference has been made to possible variations within the scope of this invention. For example, features depicted in connection with one illustrative embodiment may be used in connection with other embodiments of the invention. These and other variations and modifications in the invention will be apparent to those skilled in the art without departing from the scope of the invention, and it should be understood that this invention is not limited to the illustrative embodiments set forth herein. Accordingly, the invention is to be limited only by the claims provided below and equivalents thereof.

What is claimed is:

1. A method of making a curved barrier film, comprising:
   (a) depositing a barrier layer between a first organic layer and a second organic layer to form a barrier film; and
   (b) thermoforming the barrier film from a flat barrier film to a curved barrier film;
   wherein the curved barrier film comprises
      the barrier layer having two opposing major surfaces, wherein the barrier layer comprises buckling deformations and non-buckling regions;
      the first organic layer in direct contact with one of the opposing major surfaces of the barrier layer,
      the second organic layer in direct contact with the other of the opposing major surfaces of the barrier layer; and wherein the curved barrier film is stretched to no less than 1% relative to its unstretched flat state.

2. The method of claim 1, further comprising applying heat to the barrier film before the step (b).

3. The method of claim 1, further comprising depositing the first organic layer or the second organic layer on a substrate.

4. The method of claim 3, wherein the substrate is heat-shrinkable.

5. The method of claim 4, wherein the heat-shrinkable substrate shrinks at a predetermined temperature.

6. The method of claim 4, wherein the heat shrinkable substrate comprises an organic polymer.

7. The method of claim 1, wherein the barrier layer comprises a metal oxide, a mixed metal oxide, a metal fluoride, a mixed metal fluoride, a metal nitride, a mixed metal nitride, a metal carbide, a mixed metal carbide, a metal carbonitride, a mixed metal carbonitride, a metal oxynitride, a mixed metal oxynitride, a metal boride, a mixed metal boride, a metal oxy boride, a mixed metal oxy boride, a metal silicide, a mixed metal silicide, or combinations thereof.

8. The method of claim 7, wherein the barrier layer comprises metal oxide.

9. The method of claim 8, wherein the metal oxide is silicon oxide, aluminum oxide, titanium oxide, indium oxide, tin oxide, indium tin oxide (ITO), hafnium oxide, tantalum oxide, zirconium oxide, zinc oxide, niobium oxide, or combinations thereof.

10. The method of claim 1, wherein the first organic layer or the second organic layer comprises an acrylate.

* * * * *